(12) United States Patent
Tsuchiya et al.

(10) Patent No.: US 7,514,902 B2
(45) Date of Patent: Apr. 7, 2009

(54) BATTERY PACK AND REMAINING BATTERY POWER CALCULATION METHOD

(75) Inventors: Yukio Tsuchiya, Kanagawa (JP); Hideyuki Sato, Chiba (JP); Osamu Nagashima, Tokyo (JP)

(73) Assignee: Sony Corporation, Tokyo (JP)

( * ) Notice: Subject to any disclaimer, the term of this patent is extended or adjusted under 35 U.S.C. 154(b) by 334 days.

(21) Appl. No.: 10/987,873

(22) Filed: Nov. 12, 2004

(65) Prior Publication Data

US 2005/0127877 A1    Jun. 16, 2005

(30) Foreign Application Priority Data

Nov. 14, 2003    (JP) .............................. 2003-384673

(51) Int. Cl.
*H02J 7/00*    (2006.01)
*H02J 7/04*    (2006.01)

(52) U.S. Cl. .................. 320/132; 320/130; 320/150

(58) Field of Classification Search ................. 320/150, 320/130, 132, 152–153; 324/426–429, 431–433
See application file for complete search history.

(56) References Cited

U.S. PATENT DOCUMENTS

| 6,236,214 | B1 | 5/2001 | Camp, Jr. et al. |
| 2002/0036481 | A1 | 3/2002 | Nagase |
| 2002/0093312 | A1 | 7/2002 | Choo |
| 2002/0105303 | A1 | 8/2002 | Kishi et al. |

OTHER PUBLICATIONS

Patent Abstracts of Japan, JP 2003 153452 A (Nissan Motor Co Ltd) May 23, 2003.
Patent Abstracts of Japan, JP 2001-008375 A (Matsushita Electric Ind Co Ltd) Jan. 12, 2001.
Patent Abstracts of Japan, JP 2004 191150 A (Matsushita Electric Ind Co Ltd) Jul. 8, 2004.

*Primary Examiner*—Akm E Ullah
*Assistant Examiner*—Richard V Muralidar
(74) *Attorney, Agent, or Firm*—Frommer Lawrence & Haug LLP; William S. Frommer; Ellen Marcie Emas

(57) ABSTRACT

To reduce calculation errors of remaining batter power so as to take into account capacity diminutions due to cycle degradation and temperature, a remaining power calculation device specifies a temperature correction value for calculation of remaining battery power corresponding to temperature, from among temperature correction values changed every predetermined number of charge/discharge cycles stored in a correction value storage device, on the basis of a temperature of a battery cell measured by a temperature measurement device and the number of charge/discharge cycles counted by a charge/discharge counting device, and calculates remaining battery power corresponding to the specified temperature correction value. Temperature correction values changed every predetermined number of charge/discharge cycles are used instead of setting different temperature correction values for all charge/discharge cycles, whereby correction of remaining battery power based on cycle degradation and temperature is performed with a small number of parameters.

19 Claims, 11 Drawing Sheets

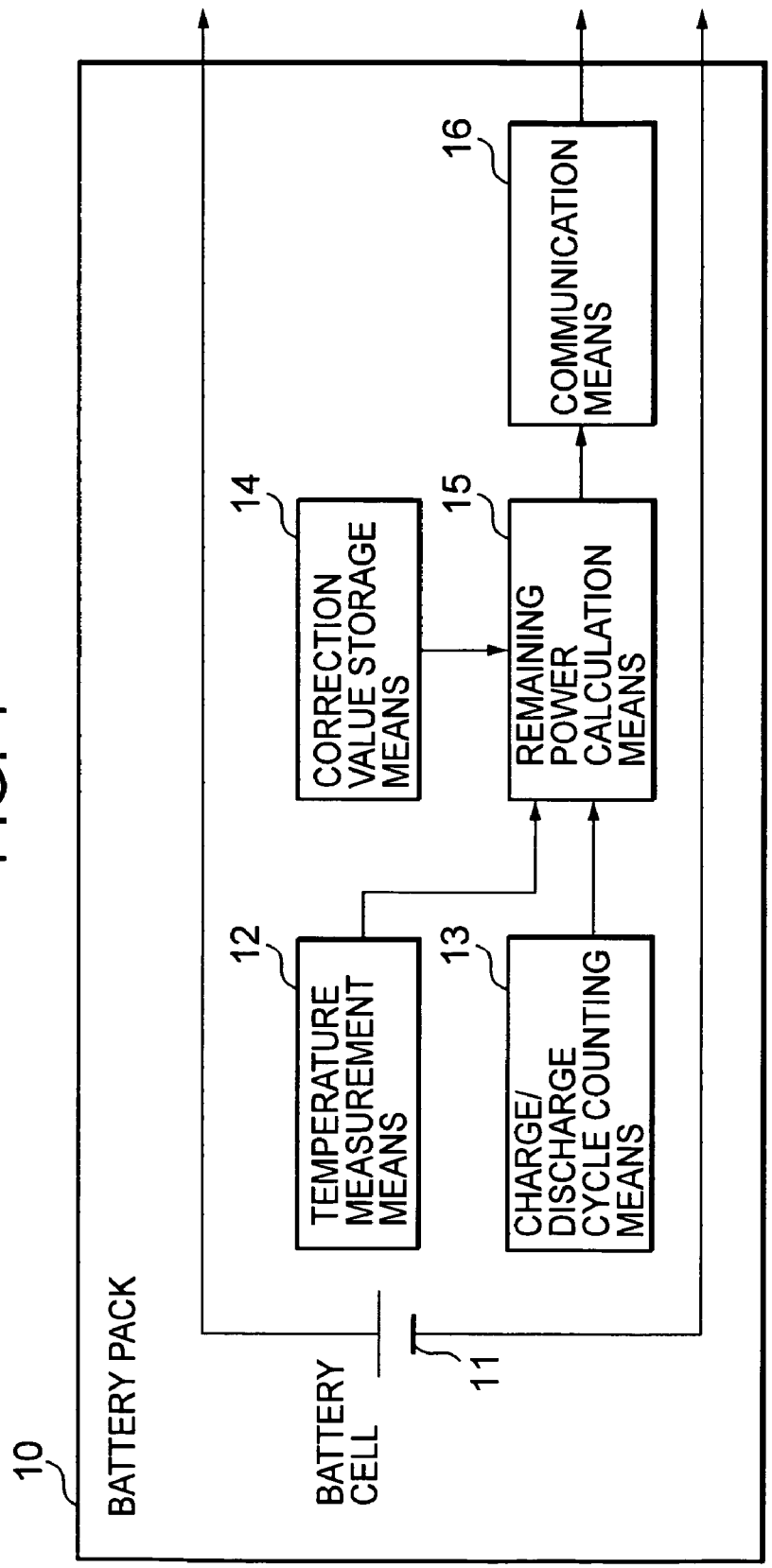

FIG. 2

| | | |
|---|---|---|
| UP TO 50 CHARGE/ DISCHARGE CYCLES | ADDRESS 00 | TEMPERATURE CORRECTION VALUE FOR UP TO 0 °C |
| | ADDRESS 01 | TEMPERATURE CORRECTION VALUE FOR 0-10 °C |
| | ADDRESS 02 | TEMPERATURE CORRECTION VALUE FOR 10-20 °C |
| | ADDRESS 03 | TEMPERATURE CORRECTION VALUE FOR 20-30 °C |
| | ADDRESS 04 | TEMPERATURE CORRECTION VALUE FOR 30-40 °C |
| | ADDRESS 05 | TEMPERATURE CORRECTION VALUE FOR 40-50 °C |
| | ADDRESS 06 | TEMPERATURE CORRECTION VALUE FOR 50 °C OR ABOVE |
| 51-100 CHARGE/ DISCHARGE CYCLES | ADDRESS 10 | TEMPERATURE CORRECTION VALUE FOR UP TO 0 °C |
| | ADDRESS 11 | TEMPERATURE CORRECTION VALUE FOR 0-10 °C |
| | ADDRESS 12 | TEMPERATURE CORRECTION VALUE FOR 10-20 °C |
| | ADDRESS 13 | TEMPERATURE CORRECTION VALUE FOR 20-30 °C |
| | ADDRESS 14 | TEMPERATURE CORRECTION VALUE FOR 30-40 °C |
| | ADDRESS 15 | TEMPERATURE CORRECTION VALUE FOR 40-50 °C |
| | ADDRESS 16 | TEMPERATURE CORRECTION VALUE FOR 50 °C OR ABOVE |
| 101-150 CHARGE/ DISCHARGE CYCLES | ADDRESS 20 | TEMPERATURE CORRECTION VALUE FOR UP TO 0 °C |
| | ADDRESS 21 | TEMPERATURE CORRECTION VALUE FOR 0-10 °C |
| | ADDRESS 22 | TEMPERATURE CORRECTION VALUE FOR 10-20 °C |
| | ADDRESS 23 | TEMPERATURE CORRECTION VALUE FOR 20-30 °C |
| | ADDRESS 24 | TEMPERATURE CORRECTION VALUE FOR 30-40 °C |
| | ADDRESS 25 | TEMPERATURE CORRECTION VALUE FOR 40-50 °C |
| | ADDRESS 26 | TEMPERATURE CORRECTION VALUE FOR 50 °C OR ABOVE |
| 151 OR MORE CHARGE/ DISCHARGE CYCLES | ADDRESS 30 | TEMPERATURE CORRECTION VALUE FOR UP TO 0 °C |
| | ADDRESS 31 | TEMPERATURE CORRECTION VALUE FOR 0-10 °C |
| | ADDRESS 32 | TEMPERATURE CORRECTION VALUE FOR 10-20 °C |
| | ADDRESS 33 | TEMPERATURE CORRECTION VALUE FOR 20-30 °C |
| | ADDRESS 34 | TEMPERATURE CORRECTION VALUE FOR 30-40 °C |
| | ADDRESS 35 | TEMPERATURE CORRECTION VALUE FOR 40-50 °C |
| | ADDRESS 36 | TEMPERATURE CORRECTION VALUE FOR 50 °C OR ABOVE |

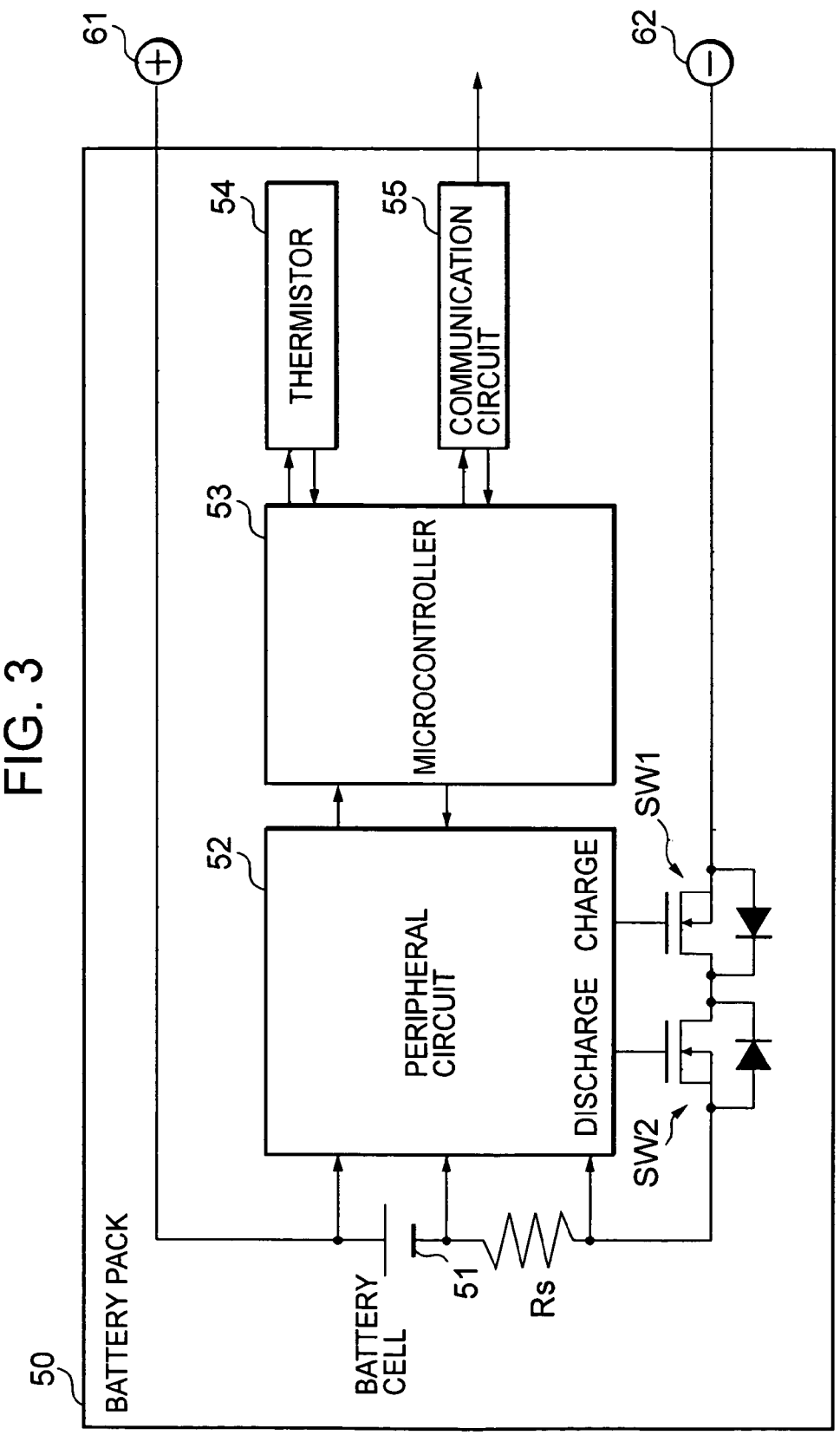

BATTERY PACK AND REMAINING BATTERY POWER CALCULATION METHOD

CROSS REFERENCES TO RELATED APPLICATONS

The present document is based on Japanese Priority Document JP2003-384673, filed to the Japanese Patent Office on Nov. 14, 2003, the entire contents of which being incorporated herein by reference to the extent permitted by law.

BACKGROUND OF THE INVENTION

1. Field of the Invention

The present invention relates to a battery pack and a remaining battery power calculation method, and more particularly, to a battery pack and a remaining battery power calculation method which permits calculating remaining battery power according to the number of charge/discharge cycles and temperature during use of the battery.

2. Related Art

Battery packs (secondary batteries) such as liquid ion batteries have specific capacities, and their capacities have the characteristic of varying according to the temperature under which the battery pack is used.

When a battery pack is used under low temperature, the internal impedance of its battery cell increases and when the same current as normal temperature is applied, a large voltage drop occurs, so the capacity of the battery pack decreases.

FIG. 11 is a graph showing discharge characteristics of a battery pack at 25° C., 10° C. and 0° C. The abscissa represents time, while the ordinate represents voltage.

As shown in FIG. 11, in the case where its discharge power and end voltage are set to 2.0 W and 3.35 V, respectively, the following measurement result is obtained: if a dischargeable capacity in an environment of, for example, 25° C. is set to 100%, approximately 80% dischargeable capacity and approximately 60% dischargeable capacity are respectively obtained in environments of 10° C. and 0° C.

On the other hand, the battery pack has the characteristic of decreasing its capacity even in the case where it continues to be used and the number of charge/discharge cycles increases. This is because the battery pack repeats a charge/discharge cycle and its battery cell is degraded, so the usable capacity thereof decreases, and called 'cycle degradation'.

The usable capacity of a battery which has undergone a large number of charge/discharge cycles is changed by two factors: cycle degradation and temperature during use.

The technique of detecting the temperature of a battery pack by using a temperature sensor and correcting the remaining battery power has heretofore been used to correct battery capacity diminutions during use at low temperatures, as in Japanese Laid-Open Patent Application JP-A-2000-260488 (Paragraph Numbers [0038]-[0072]), for example.

Similarly, the technique of counting the number of charge/discharge cycles, determining that cycle degradation is advancing, according to the counted number, and estimating the remaining battery power to be lower than the actual battery power is used to correct battery degradation due to the number of charge/discharge cycles.

In these conventional techniques, correction of a usable time in the current temperature environment is performed by measuring the current temperature with a thermistor, and correction of the usable time of a battery cell which has undergone a larger number of charge/discharge cycles is performed by counting the number of charge/discharge cycles.

Specifically, temperature data and correction values depending on temperate are held, and when temperature data indicates a low temperature, the remaining battery power is estimated to be lower than the actual remaining battery power, in view of the degradation of the discharge characteristic of the battery cell. Similarly, correction values for cycle degradation are prepared, and as the number of charge/discharge cycles becomes larger, the remaining battery power is estimated to be smaller. In this manner, two correction values, i.e., temperature and cycle degradation, are prepared as data stored in the battery pack, whereby the remaining battery power is corrected according to use environment and the number of times of use.

SUMMARY OF THE INVENTION

However, cycle degradation and temperature during use are correlated, and the decrease of the capacity of a battery cell in use at low temperatures has the characteristic of becoming larger as the number of charge/discharge cycles becomes larger. Namely, if correction values for correcting the decrease of the capacity due to temperatures and the degradation of the capacity due to the number of charge/discharge cycles are prepared as separate parameters, there is a problem that, as the number of charge/discharge cycles increases, errors occur between calculated remaining battery power and actually remaining battery power.

For example, there is the problem that if correction values are set so that cycle degradation at normal temperature is corrected, when the number of charge/discharge cycles becomes large, an error occurs during the calculation of remaining battery power at low temperature, whereas if correction values are set so that cycle degradation at low temperature is corrected, an error occurs during the calculation of remaining battery power at normal temperature.

The present invention has been conceived in view of the above-mentioned problems, and a preferred embodiment of the present invention provides a battery pack and a remaining battery power calculation method both of which for enabling reducing calculation errors of remaining battery power so as to take into account capacity diminutions due to cycle degradation and temperature.

According to a preferred embodiment of the present invention, there is provided a battery pack capable of calculating remaining battery power according to the number of charge/discharge cycles and temperature during use, characterized by including temperature measurement means for measuring a temperature of a battery cell, charge/discharge cycle counting means for counting the number of charge/discharge cycles, correction value storage means for storing correction values changed every predetermined number of charge/discharge cycles and to be used for calculation of remaining battery power corresponding to the temperature, remaining power calculation means for specifying a temperature correction value by searching the correction value storage means on the basis of the measured temperature and the counted number of charge/discharge cycles, and calculating remaining battery power corresponding to the specified temperature correction value.

According to this construction, the remaining power calculation means specifies a correction value for calculation of remaining battery power corresponding to temperature, from among correction values changed every predetermined number of charge/discharge cycles stored in the correction value storage means, on the basis of the temperature of the battery cell measured by the temperature measurement means and the number of charge/discharge cycles counted by the charge/ discharge counting means, and calculates remaining battery power corresponding to the specified correction value. Temperature correction values changed every predetermined number of charge/discharge cycles are used instead of setting different temperature correction values for all charge/discharge cycles, whereby correction of remaining battery power based on cycle degradation and temperature is performed with a small number of parameters.

According to the battery pack of a preferred embodiment of the present invention, a correction value for calculation of remaining battery power corresponding to temperature is specified from among correction values changed every stored predetermined number of charge/discharge cycles, on the basis of the measured temperature of the battery cell and the counted number of charge/discharge cycles, and remaining battery power corresponding to the specified correction value is calculated. Accordingly, even if the number of charge/discharge cycles increases and cycle degradation proceeds, actual remaining battery power can be calculated more accurately in various temperature environments.

In addition, since correction values changed every predetermined number of charge/discharge cycles are used, correction of remaining battery power can be performed with a small number of parameters.

The present invention can be applied to battery packs to be connected to, for example, video cameras, digital still cameras or battery chargers, and the like.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIG. 1 shows a functional block diagram of the principle of a battery pack according to a preferred embodiment of the present invention;

FIG. 2 shows examples of stored temperature correction values;

FIG. 3 shows an example of hardware configuration of a battery pack according to a preferred embodiment of the present invention;

DETAILED DESCRIPTION OF THE PREFERRED EMBODIMENTS OF THE PRESENT INVENTION

Figure 4:
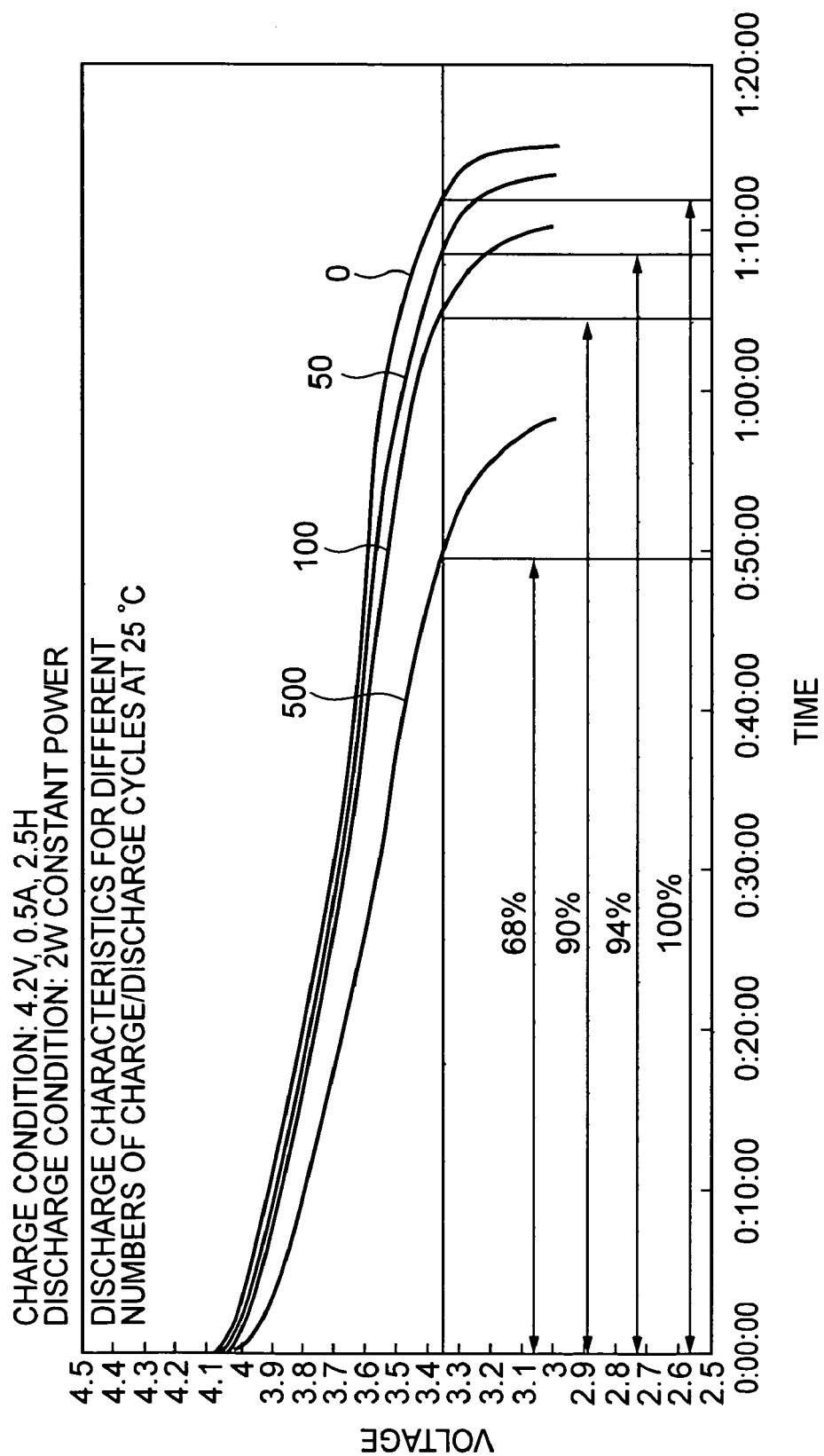
FIG. 4 shows graph of discharge characteristics of a battery cell at 25° C. (normal temperature) for different numbers of charge/discharge cycles.

A preferred embodiment of the present invention will be described below in detail with reference to the accompanying drawings.

FIG. 1 is a functional block diagram showing the principle of a battery pack according to a preferred embodiment of the present invention.

A battery pack 10 according to a preferred embodiment of the present invention includes temperature measurement means 12 for measuring the temperature of a battery cell 11, charge/discharge cycle counting means 13 for counting the number of charge/discharge cycles, correction value storage means 14 for storing correction values (hereinafter referred to as temperature correction values) changed every predetermined number of charge/discharge cycles and to be used for calculation of remaining battery power corresponding to the temperature, remaining power calculation means 15 for specifying a temperature correction value by searching the correction value storage means 14 on the basis of the measured temperature and the counted number of charge/discharge cycles, and calculating remaining battery power corresponding to the specified temperature correction value, and communication means 16 for communicating the calculated remaining battery power amount to a connected device which is not shown.

The battery cell 11 is, for example, a lithium ion battery. The temperature measurement means 12 is, for example, a thermistor which is mounted on a surface of the battery cell or a circuit board. The charge/discharge counting means 13 and the remaining power calculation means 15 are realized by, for example, a microcontroller. The correction value storage means 14 is, for example, an EEPROM (Electrically Erasable Programmable Read-Only Memory).

In the following description of the embodiment, the term "charge/discharge cycle" means the process of discharging the battery cell 11 once and subsequently discharging the battery cell 11 to a certain voltage level, and this process is defined as one charge/discharge cycle.

The temperature correction value used in a preferred embodiment of the present invention is changed every predetermined number of charge/discharge cycles.

FIG. 2 shows examples of the stored temperature correction values.

Temperature correction values for up to 50 charge/discharge cycles, for example, are respectively stored at addresses 00-06 of the correction value storage means 14. The respective addresses 00-06 store different temperature correction values according to different temperatures during use, for example, temperature correction values for the cases of up to 0° C., 0-10° C., 10-20° C., 20-30° C., 30-40° C., 40-50° C. and 50° C. or higher. For example, for 0-10° C., a temperature correction value which decreases the capacity at a rate of 10%/50 cycles is stored, and for 25° C., a temperature correction value which decreases the capacity at a rate of 4%/50 cycles is stored. Otherwise, to reduce the number of parameters, for up to 50 cycles, a temperature correction value may be set so that the capacity decreases at a rate of 4%/50 cycles as to all temperatures.

Further, values obtained by varying these temperature correction values every predetermined number of charge/discharge cycles are stored.

As shown in FIG. 2, temperature correction values for 51-100 charge/discharge cycles are stored at addresses 10-16, temperature correction values for 101-150 charge/discharge cycles are stored at addresses 20-26, temperature correction values for 150 cycles or above are stored at addresses 30-36, and the temperature correction values are modified for each of the ranges of cycles. For example, the temperature correction values may be modified by modifying the rates of decrease of the capacity into rates different from those of temperature correction values for up to 50 cycles, or by increasing or decreasing the capacity on a stepwise basis from each of the ranges of cycles to the next (this example will be described later).

The above-mentioned temperature correction values are set according to the characteristics of capacity changes corresponding to the temperature and the number of charge/discharge cycles of the battery cell 11, and are stored into the correction value storage means 14.

The operation of the battery pack 10 will be described below.

For example, when the battery pack 10 is connected to a device such as a video camera or a digital still camera and utilization thereof is started, the temperature of the battery cell 11 is measured by the temperature measurement means 12. The charge/discharge counting means 13 transfers the current counted number of charge/discharge cycles to the remaining power calculation means 15. The remaining power calculation means 15 specifies a temperature correction value from among those stored as shown in FIG. 2, by searching the correction value storage means 14 on the basis of the temperature and the number of charge/discharge cycles, and calculates remaining battery power corresponding to the specified temperature correction value. The communication means 16 communicates the remaining battery power amount which has been calculated so that a usable remaining time can be displayed on the connected device such as a video camera or a digital still camera.

In this manner, on the basis of the measured temperature of the battery cell and the counted number of charge/discharge cycles, a temperature correction value is specified from among the temperature correction values changed every predetermined number of charge/discharge cycles and the remaining battery power corresponding to the specified temperature correction value is calculated. Accordingly, even if the number of charge/discharge cycles increases and cycle degradation proceeds, actual remaining battery power can be calculated more accurately in various temperature environments.

In addition, temperature correction values changed every predetermined number of charge/discharge cycles such as 50 and 100 cycles are used instead of setting different temperature correction values for every charge/discharge cycle. Accordingly, correction of remaining battery power can be performed with a small number of parameters.

Details of a preferred embodiment of the present invention will be described below.

FIG. 3 is a hardware configuration example of a battery pack according to a preferred embodiment of the present invention.

A battery pack 50 includes a battery cell 51, a peripheral circuit 52, a microcontroller 53, a thermistor 54, and a communication circuit 55.

The battery cell 51 may be a lithium ion battery, a nickel-metal hydride battery, or a lithium polymer battery, for example.

The positive electrode of the battery cell 51 is connected to a positive terminal 61, while the negative electrode of the battery cell 51 is connected to a negative terminal 62 via a current detection resistor Rs as well as a charge control switch SW1 and a discharge control switch SW2 each made of a power MOSFET (Metal-Oxide-Semiconductor Field Effect Transistor) and a diode.

The peripheral circuit 52 has a circuit construction mainly made of a voltage comparator (comparator), and has the function of detecting a value of charge/discharge current flowing through the current detection resistor Rs, and the protection function of protecting the battery cell 51 from overcharge, overdischarge and overcurrent. Specifically, when the voltage of the battery cell 51 becomes equal to or higher than a set voltage, the peripheral circuit 52 turns off the charge control switch SW1 to stop charging, thereby preventing overcharge. On the other hand, when the voltage of the battery cell 51 turns lower than a set voltage, the peripheral circuit 52 turns off the discharge control switch SW2 to stop discharging, thereby preventing over discharge.

The microcontroller 53 cumulatively sums charge/discharge currents detected by the peripheral circuit 52, and calculates the remaining battery power according to temperature during operation and the number of charge/discharge cycles. In addition, the microcontroller 53 controls the thermistor 54 to measure the temperature of the battery cell 51 in use. The microcontroller 53 also has, as correction value storage means for storing the temperature correction values as shown in FIG. 2, for example, an EEPROM in a built-in form. The microcontroller 53 also has the function of controlling the communication circuit 55 to communicate the calculated remaining battery power amount to a connected device.

The correlation between temperature and charge/discharge cycle will be described below prior to the description of the operation of the battery pack 50 according to a preferred embodiment of the present invention.

FIG. 4 is a graph showing discharge characteristics of a battery cell at 25° C. (normal temperature) for different numbers of charge/discharge cycles.

Figure 5:
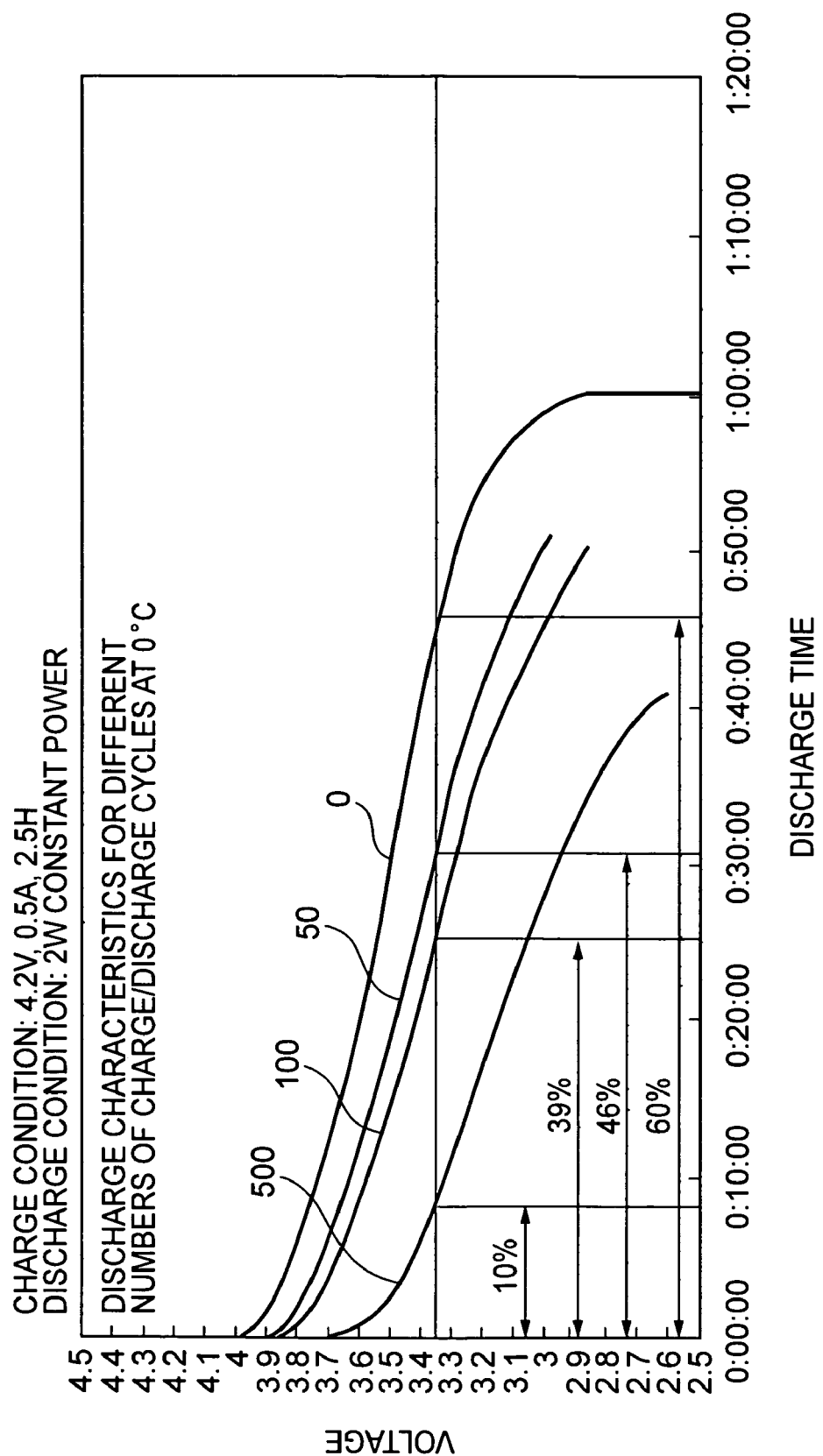
FIG. 5 shows a graph of discharge characteristics of the battery cell at 0° C. (low temperature) for the different numbers of charge/discharge cycles.

FIG. 5 is a graph showing discharge characteristics of the battery cell at 0° C. (low temperature) for the different numbers of charge/discharge cycles.

In each of FIGS. 4 and 5, the horizontal axis represents time, while the vertical axis represents voltage, and there are shown discharge characteristics obtained when a charge/discharge cycle is repeated under the conditions of voltage 4.2 V, current 0.5 A and 2.5 hours, and under the discharge condition of 2 W constant power.

As shown in FIG. 4, during use at, for example, 25° C. (normal temperature), in the case where the battery cell 51 discharges to, for example, 3.35 V and the discharge time of the battery cell 51 used by 0 charge/discharge cycles is 100%, the one used by 50 cycles shows 94% discharge time, the one used by 100 cycles shows 90% discharge time, and the one used by 500 cycles shows a discharge time as short as 68%. That is to say, each time the battery cell 51 is used by 50 cycles, a capacity decrease of approximately 5% due to cycle degradation is observed.

On the other hand, as shown in FIG. 5, during use at 0° C. (low temperature), even the battery cell 51 used by 0 charge/discharge cycles shows a discharge time as short as 60%, compared to the battery cell 51 used by 0 charge/discharge cycles at normal temperature as shown in FIG. 4. As the number of charge/discharge cycles of the battery pack 10 at 0° C. increases, the discharge time decreased to 46% for 50 cycles, 39% for 100 cycles, and 10% for 500 cycles as compared to the battery cell 51 used by, at normal temperature, 0 charge/discharge cycles. Namely, it can be seen that the rate of cycle degradation of the battery cell 51 used at 0° C. is large compared to the battery cell 51 used at normal temperature.

Figure 6:
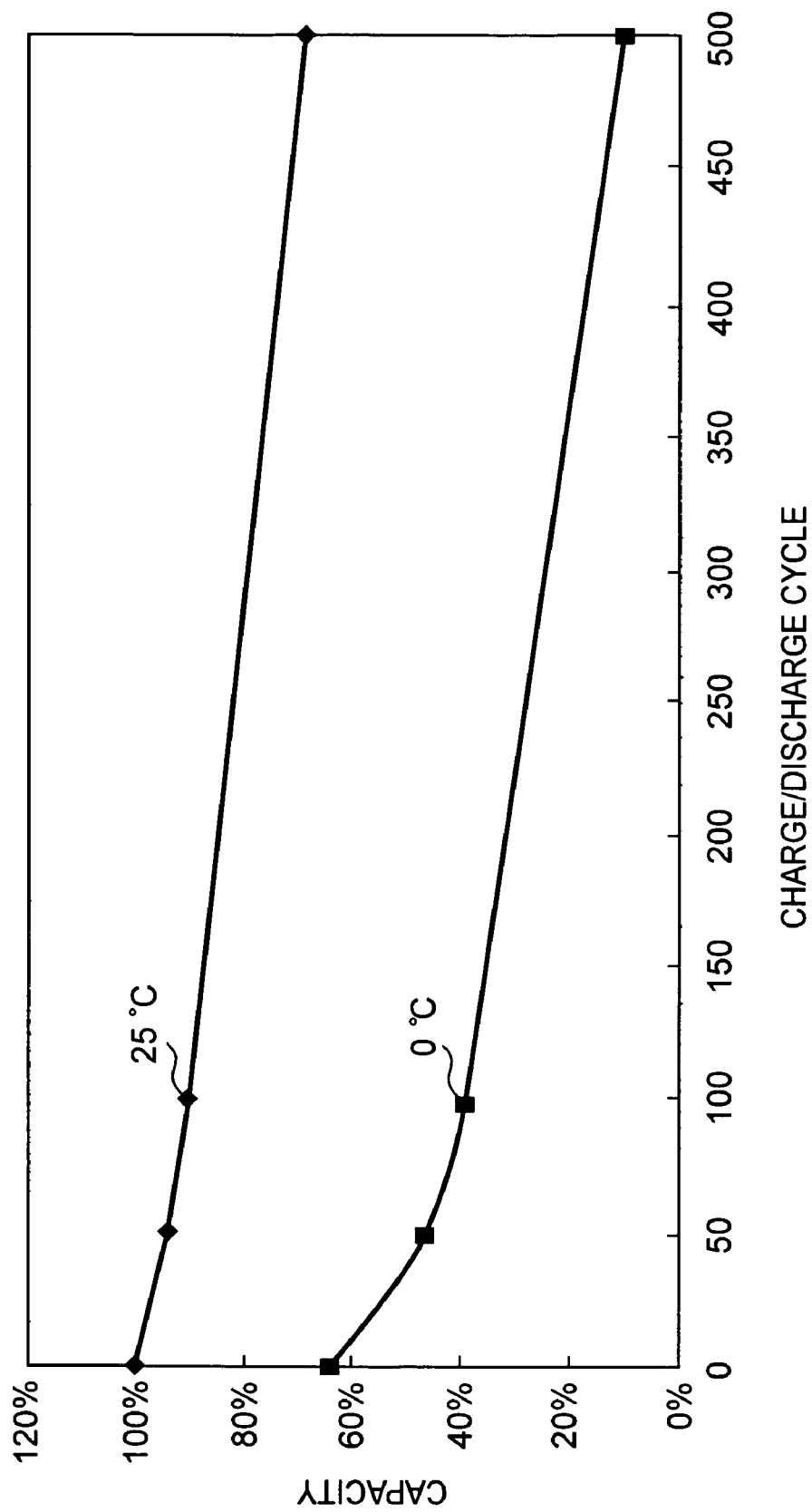
FIG. 6 shows a graph of the characteristics of capacity changes corresponding to the temperature and the number of charge/discharge cycles of a battery cell.

FIG. 6 is a graph showing the characteristics of capacity changes corresponding to the temperature and the number of charge/discharge cycles of a battery cell.

The horizontal axis represents the number of charge/discharge cycles, while the vertical axis represents capacity. The capacity of a battery cell used by 0 charge/discharge cycles at 25° C. (normal temperature) is 100%.

It can be seen from FIG. 6 that the degree of cycle degradation due to an increase in the number of charge/discharge cycles becomes larger at lower temperatures.

If this cycle degradation is to be corrected with two parameters such as the number of charge/discharge cycles and operation temperature, it will be difficult to calculate correct remaining battery power.

Figure 7:
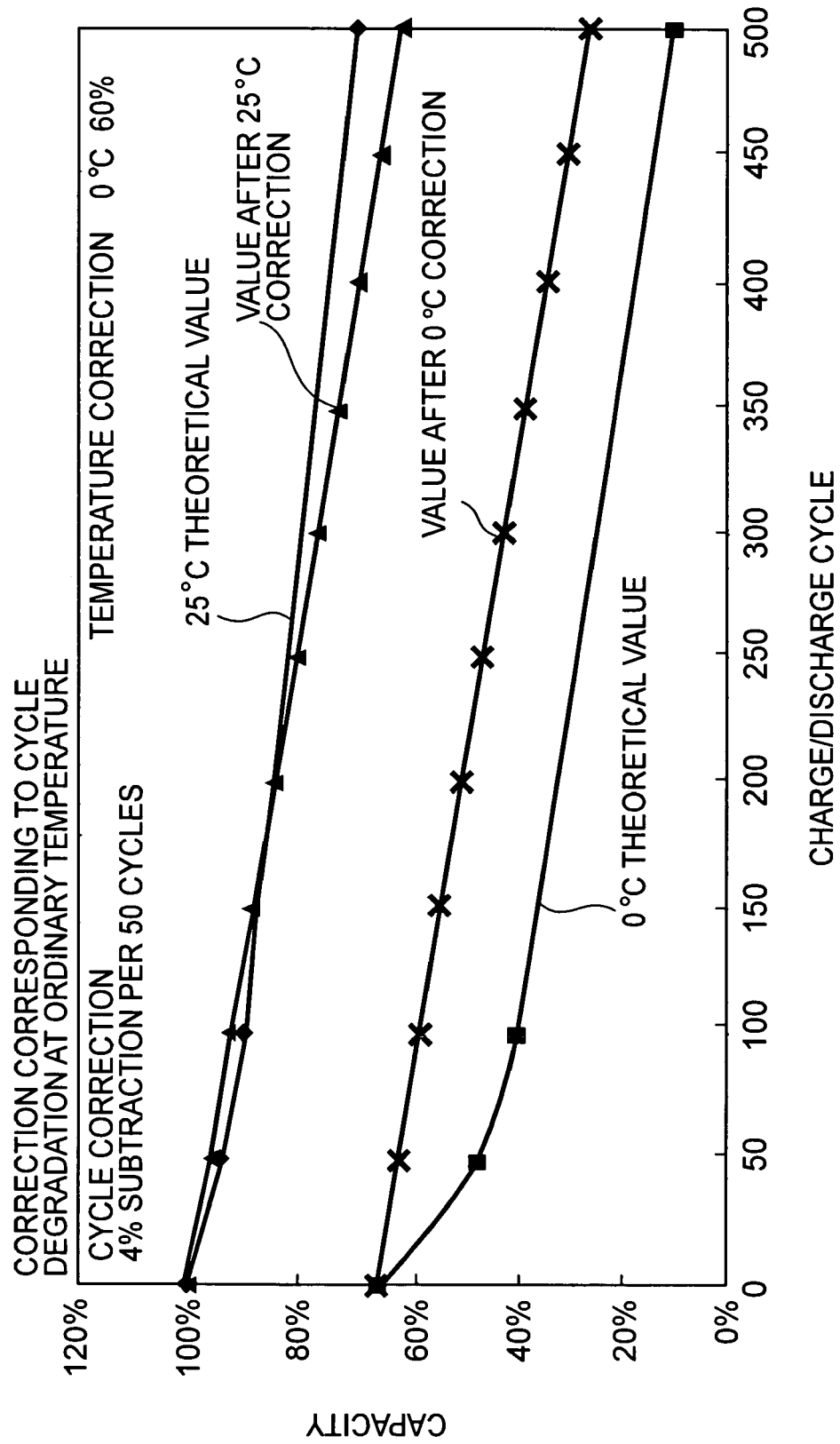
FIG. 7 shows a graph of the relationship between the number of charge/discharge cycles and the capacity during correction performed according to cycle degradation at normal temperature.

FIG. 7 is a graph showing a relationship between the number of charge/discharge cycles and capacity at normal temperature and low temperature, at time of correction in synchronization with cycle degradation at normal temperature.

FIG. 7 shows a corrected parameter which is set to linearly decrease the capacity by 4% every 50 cycles, according to cycle degradation at 25° C. (at normal temperature), in the graph of FIG. 6 showing the relationship between the number of charge/discharge cycles and the capacity at normal temperature and low temperature. In this event, if the capacity of the battery cell used by 0 charge/discharge cycles at 0° C. (low temperature) is set to 65%, when the number of charge/discharge cycles increases, errors from theoretical values increase as shown in FIG. 7. Namely, a problem is likely to occur in that, although calculated remaining battery power is still a usable value, actual remaining battery power is lower than the calculated remaining battery power and cannot be used.

Figure 8:
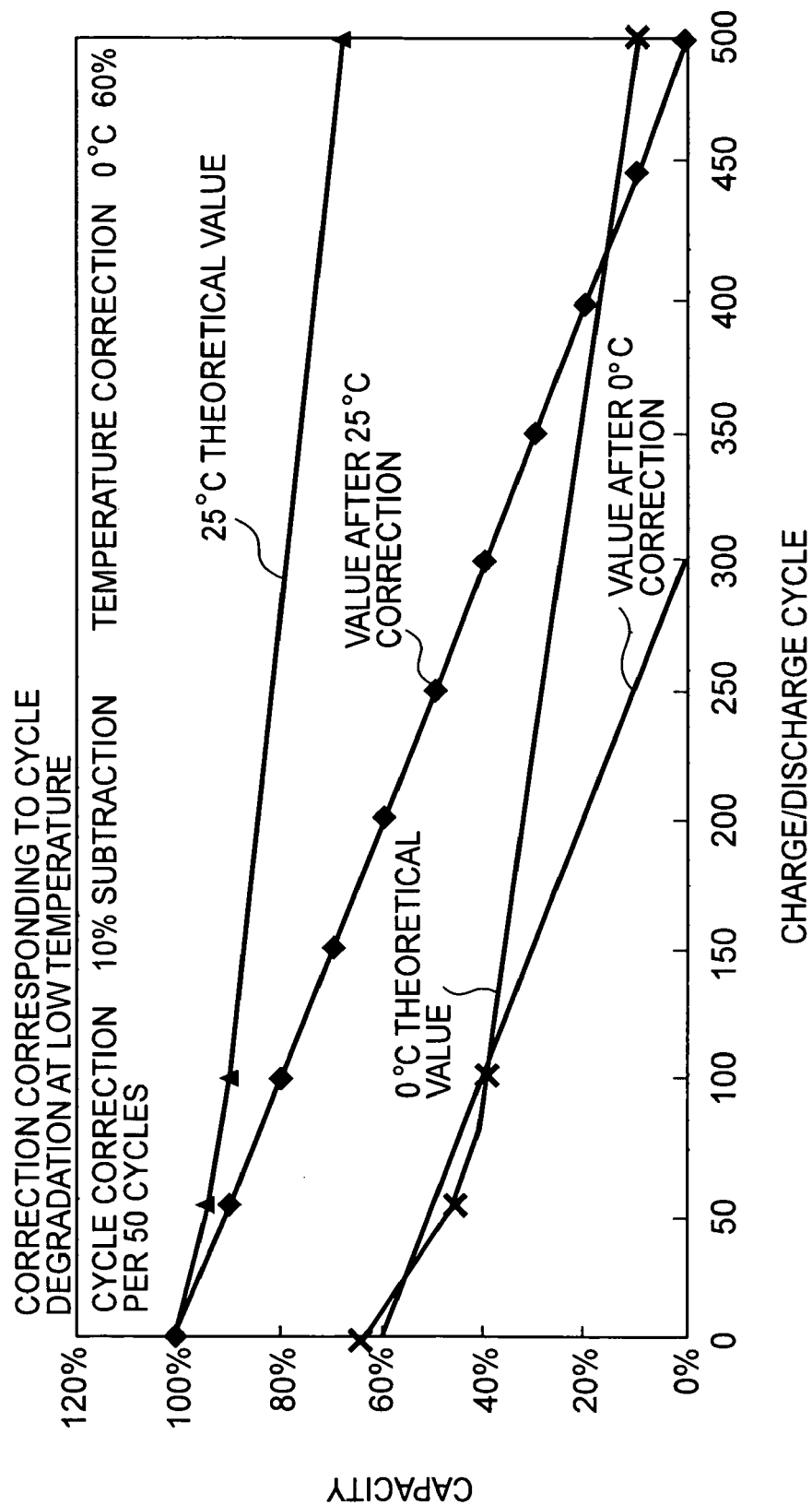
FIG. 8 shows a graph of the relationship between the number of charge/discharge cycles and the capacity during correction performed according to cycle degradation at low temperature.

FIG. 8 is a graph showing a relationship between the number of charge/discharge cycles and the capacity at normal temperature and low temperature in the case where correction is performed according to cycle degradation at the low temperature.

FIG. 8 is a graph in which the capacity is set to 60% for 0 charge/discharge cycles and correction is performed with a parameter which is set to linearly decrease the capacity by 10% every 50 cycles, according to cycle degradation at 0° C. (low temperature) (for example, the range of 0-100 charge/discharge cycles), in the graph of FIG. 6 showing the relationship between the number of charge/discharge cycles and the capacity at normal temperature and low temperature. In this event, as the number of charge/discharge cycles increases at 25° C. (normal temperature), errors from theoretical values increase. Accordingly, a problem is likely to occur in that, although the battery having an increased number of charge/discharge cycles can be actually used at normal temperature, calculated remaining battery power is lower than actual remaining battery power.

If correction values for correcting cycle degradation and correction values for correcting capacity diminutions due to temperature are prepared in combination, it is possible to calculate correct remaining battery power in either case of normal temperature or low temperature, but there is the problem that the number of parameters increases and setting becomes difficult.

On the other hand, the battery pack 50 according to a preferred embodiment of the present invention can solve the problem by using temperature correction values changed every predetermined number of charge/discharge cycles such as 50 and 100 cycles, as shown in FIG. 2.

The operation of the battery pack 50 according to a preferred embodiment of the present invention will be described below.

When the positive terminal 61 and the negative terminal 62 of the battery pack 50 are connected to a device such as a video camera or a digital still camera, for example, and utilization of the battery pack 50 is started, the microcontroller 53 cumulatively sums charge/discharge current values detected by the peripheral circuit 52, and calculates the remaining battery power. In addition, the microcontroller 53 counts the number of charge/discharge cycles, and stores the number of charge/discharge cycles into, for example, an internal EEPROM of the microcontroller 53.

During the calculation of remaining battery power, the microcontroller 53 specifies a temperature correction value by searching, for example, the EEPROM in which the temperature correction values shown in FIG. 2 are stored, on the basis of the temperature measured by the thermistor 54 and the number of charge/discharge cycles, and calculates remaining battery power corresponding to the specified temperature correction value.

Figure 9:
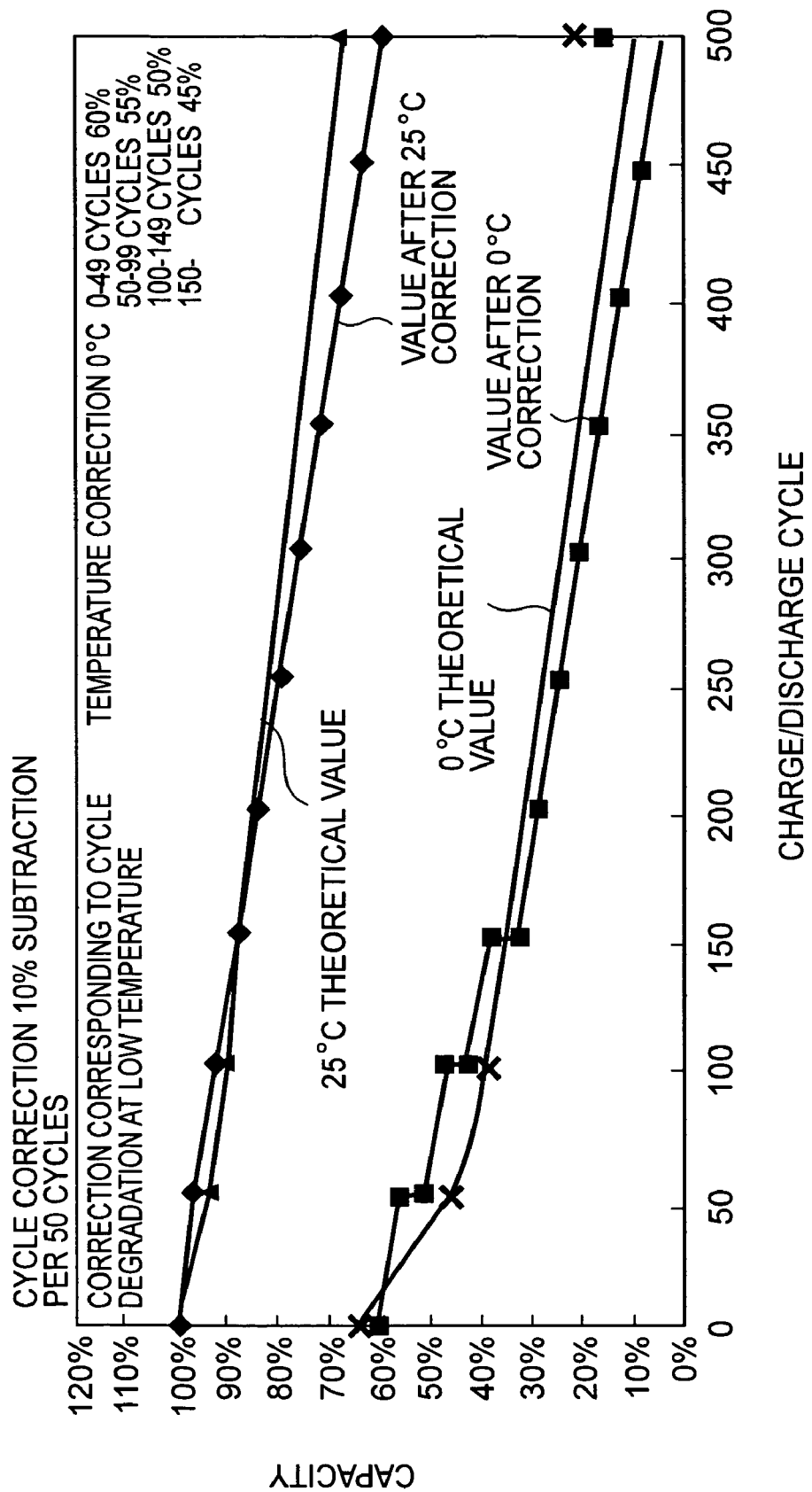
FIG. 9 shows a graph of a manner in which correction is effected with the battery pack according to a preferred embodiment of the present invention.

FIG. 9 is a graph showing the manner in which correction is effected with the battery pack according to a preferred embodiment of the present invention.

FIG. 9 is a graph in which cycle correction which linearly decreases the capacity by 4% every 50 cycles is effected according to cycle degradation at 25° C. (normal temperature) in the graph of FIG. 6 showing the relationship between the number of charge/discharge cycles and the capacity at normal temperature and low temperature. In this case, cycle correction is performed which decreases the capacity of the battery pack in use at low temperature on a stepwise basis every 50 cycles (in the example of FIG. 9, up to 150 cycles). Namely, temperature correction values which decrease the capacity on a stepwise basis each time the number of charge/discharge cycles reaches 50, 100 and 150 are configured. In the other periods, temperature correction values are configured which linearly decrease the capacity by 4% similarly to those for normal temperature. Since the temperature correction values changed every predetermined number of charge/discharge cycles are used, correction of remaining battery power can be effected with a small number of parameters.

In the above description, reference has been made to a case where cycle correction which linearly decreases the capacity by 4% every 50 cycles according to cycle degradation at normal temperature. However during use at normal temperature, cycle correction which increases the capacity on a stepwise basis every 50 cycles may be performed, so that cycle correction which decreases the capacity by 10% every 50 cycles, for example, is performed according to cycle degradation at low temperature.

The communication circuit 55 communicates the remaining battery power calculated in this manner to a connected device, not shown in the figures, under the control of the microcontroller 53, whereby a video camera and a digital still camera, for example, can inform a user of a value near the time during which the battery pack 50 can actually discharge under the current environment.

The processing of the battery pack according to a preferred embodiment of the present invention will be summarized below in the form of a flowchart.

Figure 10:
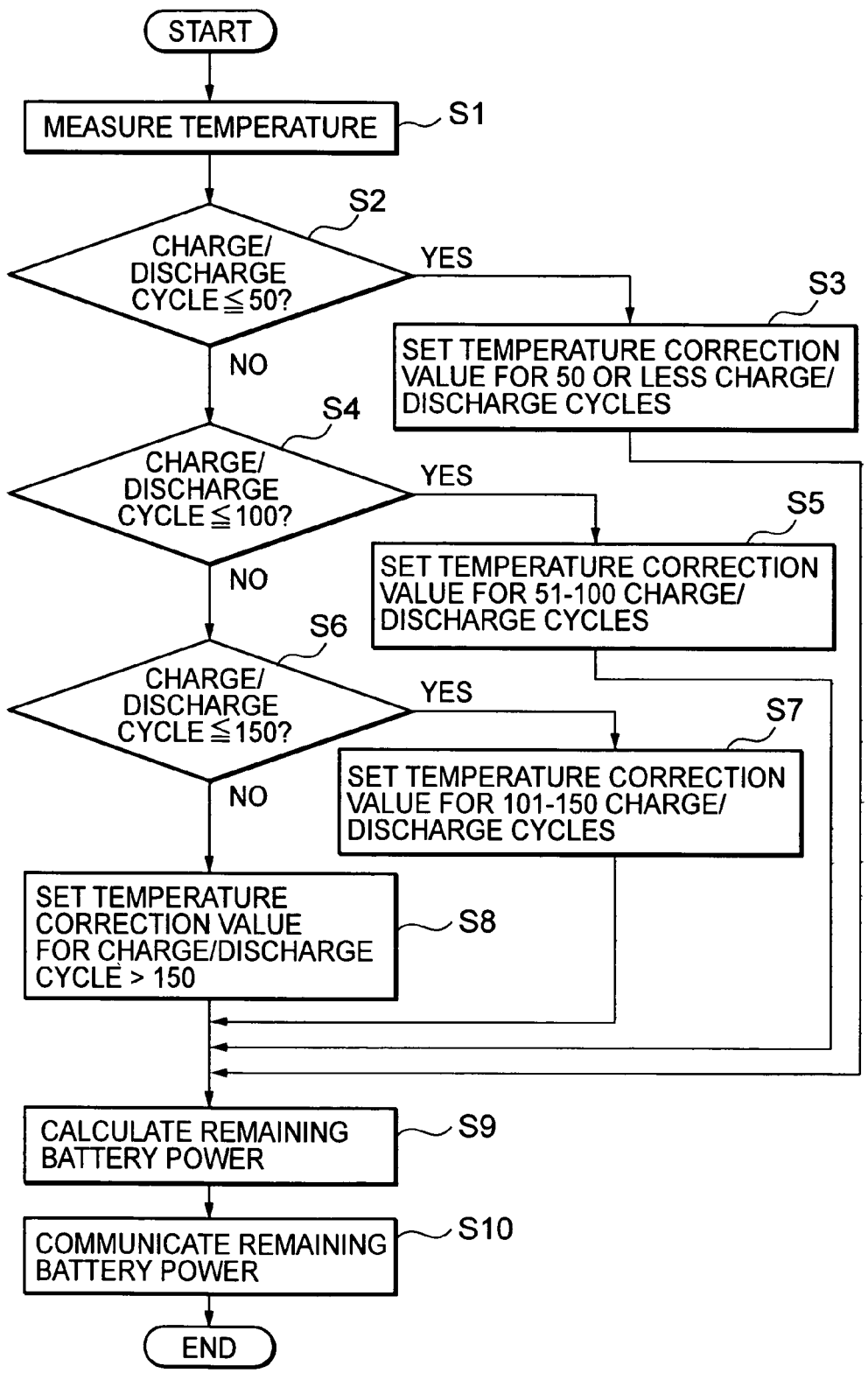
FIG. 10 shows a flowchart of the processing of the battery pack according to a preferred embodiment of the present invention.
Figure 11:
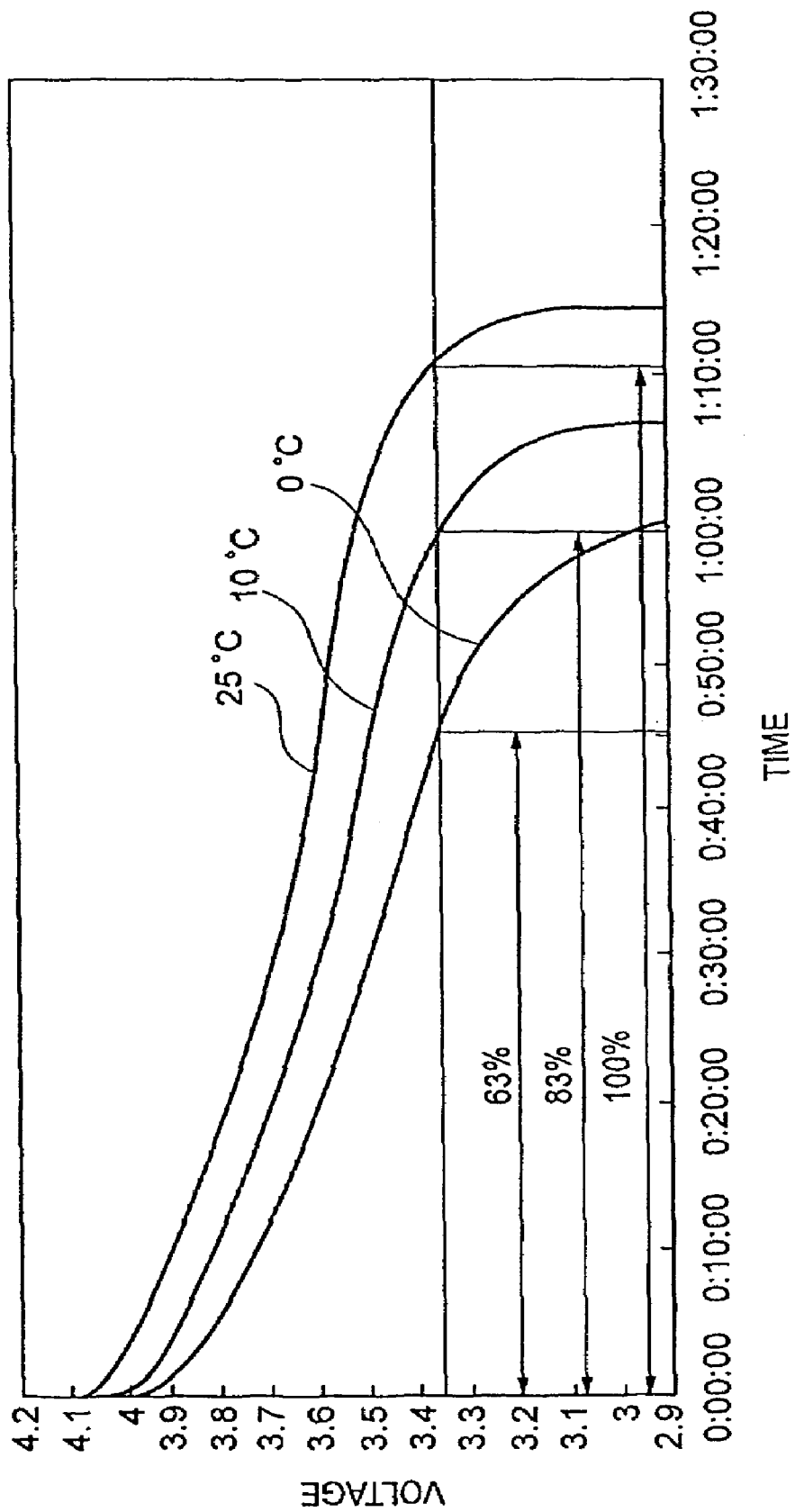
FIG. 11 shows a graph of discharge characteristics of a battery pack at 25° C., 10° C. and 0° C.

FIG. 10 is a flowchart showing the flow of the processing of the battery pack according to a preferred embodiment of the present invention.

Step S1: Temperature Measurement

The microcontroller 53 controls the thermistor 54 to measure the temperature of the battery cell 51. The processing of the following Steps S2 to S8 is the processing of specifying a temperature correction value according to the measured temperature and the number of charge/discharge cycles. In this description, reference is made to the case where four kinds of temperature correction values for up to 50 charge/discharge cycles, 50-100 charge/discharge cycles, 101-150 charge/discharge cycles, and 151 or more charge/discharge cycles are stored in the EEPROM built in the microcontroller 53, for example.

The microcontroller 53 determines whether the number of charge/discharge cycles is not greater than 50 (Step S2), and if the number of charge/discharge cycles is not greater than 50, the microcontroller 53 searches the EEPROM and sets a temperature correction value for not greater than 50 charge/discharge cycles according to the temperature measured in the processing of Step S1, in Step S3. If the number of charge/discharge cycles is greater than 50, then the microcontroller 53 determines whether the number of charge/discharge cycles is not greater than 100, in Step S4. In Step S4, if the number of charge/discharge cycles is not greater than 100, the microcontroller 53 searches the EEPROM and sets a temperature correction value for 51-100 charge/discharge cycles according to the temperature measured in the processing of Step S1, in Step S5. If the number of charge/discharge cycles is greater than 100, then the microcontroller 53 determines whether the number of charge/discharge cycles is not greater than 150, in Step S6. In Step S6, if the number of charge/discharge cycles is not greater than 150, the microcontroller 53 searches the EEPROM and sets a temperature correction value for 101-150 charge/discharge cycles according to the temperature measured in the processing of Step S1, in Step S7. If the number of charge/discharge cycles is greater than 150, then the microcontroller 53 searches the EEPROM and sets a temperature correction value for 150 charge/discharge cycles or more according to the temperature measured in the processing of Step S1, in Step S8.

When the temperature correction value is set in Step S3, S5, S7 or S8, the microcontroller 53 calculates remaining battery power corresponding to the temperature correction value, in Step S9. The microcontroller 53 controls the communication circuit 55 to communicate the calculated remaining battery power amount to the connected device which is not shown.

The above-mentioned processing may be realized by software provided in the microcontroller 53 and therefore can be realized without significant cost increase compared to existing products.

It is to be observed that the present invention is not limited to the above-mentioned examples of preferred embodiments, which are merely descriptions of the present invention in its preferred form under a certain degree of particularity. They are by no means to be construed so as to limiting the scope of the present invention. Accordingly, it is to be understood by those of ordinary skill in the art that many other changes, variations, combinations, sub-combinations and the like are possible therein without departing from the scope and spirit of the present invention.

What is claimed is:

1. A battery pack comprising a battery cell and being capable of calculating a remaining battery power according to a number of charge/discharge cycles and temperature during operation, comprising:
    temperature measurement means for measuring temperature of said battery cell;
    charge/discharge cycle counting means for counting a number of charge/discharge cycles;
    correction value storage means for storing correction values as a function of a range of the number of charge/discharge cycles and a range in temperature, each correction value corresponding to one range of charge/discharge cycles and one range in temperature; and
    remaining power calculation means for specifying one correction value by searching the correction value storage means based on the measured temperature and the counted number of charge/discharge cycles, and calculating the remaining battery power corresponding to the specified correction value,
    wherein at a low temperature range, the correction values change the remaining battery power of the battery pack on a stepwise basis every predetermined number of cycles up to a specified number of cycles and thereafter linearly changes the remaining battery power every predetermined number of cycles.

2. The battery pack according to claim 1, wherein the correction value comprises a value which is based on characteristics of capacity change that occurs in response to the temperature and the number of charges/discharges of the battery cell.

3. The battery pack according to claim 1, further comprising a communications means for communicating the calculated remaining battery power amount to a connected device.

4. A remaining battery power calculating method of calculating a remaining battery power according to a number of charge/discharge cycles and temperature during operation, comprising the steps of:
    measuring temperature of a battery cell;
    specifying a temperature correction value for calculating a remaining battery power corresponding to the measured temperature, wherein said value is derived from at least one of a plurality of stored values, each stored value corresponding to at least one temperature value and to a range of charge/discharge cycles, each range comprising a plurality of numbers of charge/discharge cycles, said derived value being selected based on the measured temperature and the current number of charge/discharge cycles; and
    calculating the remaining battery power corresponding to the temperature correction value,
    wherein at a low temperature range, the correction values change the remaining battery power of the battery pack on a stepwise basis every predetermined number of cycles up to a specified number of cycles linearly changes the remaining battery power every predetermined number of cycles.

5. The battery pack according to claim 1, wherein each correction value comprises a value that represents a rate of change of capacity with respect to number of charge/discharge cycles for the corresponding range of number of charge/discharge cycles.

6. The battery pack according to claim 1, wherein each said correction value corresponds to one of at least one temperature range.

7. The battery pack according to claim 1, wherein each said correction value corresponds to one of a plurality of temperature ranges.

8. The battery pack according to claim 7, wherein at least one of the plurality of temperature ranges is a range of at least about ten degrees Celsius.

9. The battery pack according to claim 1, wherein for each of at least one said range of number of charge/discharge cycles, a plurality of the correction values are stored for a respective plurality of temperature ranges.

10. The battery pack according to claim 1, wherein at least one of said range of number of charge/discharge cycles is a range spanning at least about fifty consecutive numbers of charge/discharge cycles.

11. The battery pack according to claim 1, wherein for each of at least one said range of number of charge/discharge cycles, a sole corresponding one of the correction values is stored.

12. The remaining battery power calculating method according to claim 4, wherein the stored values comprise values that each represents a rate of change of capacity with respect to number of charge/discharge cycles for the corresponding range of number of charge/discharge cycles.

13. The remaining battery power calculating method according to claim 4, wherein for each said stored value the corresponding at least one temperature comprises a temperature range.

14. The remaining battery power calculating method according to claim 4, wherein for each said stored value the corresponding at least one temperature value comprises one of a plurality of temperature ranges.

15. The remaining battery power calculating method according to claim 14, wherein at least one of the plurality of temperature ranges is a range of at least about ten degrees Celsius.

16. The remaining battery power calculating method according to claim 4, wherein for each of at least one said range of number of charge/discharge cycles, a plurality of the stored values are stored for a respective plurality of corresponding temperature values.

17. The remaining battery power calculating method according to claim 4, wherein at least one said range of number of charge/discharge cycles is a range spanning at least about fifty consecutive numbers of charge/discharge cycles.

18. The remaining battery power calculating method according to claim 4, wherein for each of at least one said range of number of charge/discharge cycles, a sole corresponding one of the stored values is stored.

19. The remaining battery power calculating method according to claim 4, wherein said stored values comprise a plurality of stored values that each corresponds to a respective range of number of charge/discharge cycles.

* * * * *